(12) United States Patent
Sasaki

(10) Patent No.: US 11,532,783 B2
(45) Date of Patent: Dec. 20, 2022

(54) MAGNETIC RECORDING ARRAY, NEUROMORPHIC DEVICE, AND METHOD OF CONTROLLING MAGNETIC RECORDING ARRAY

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 40 days.

(21) Appl. No.: 17/269,056

(22) PCT Filed: Mar. 5, 2020

(86) PCT No.: PCT/JP2020/009460
§ 371 (c)(1),
(2) Date: Feb. 17, 2021

(87) PCT Pub. No.: WO2021/176656
PCT Pub. Date: Sep. 10, 2021

(65) Prior Publication Data
US 2022/0006004 A1   Jan. 6, 2022

(51) Int. Cl.
*G11C 11/00* (2006.01)
*H01L 43/04* (2006.01)
*G06N 3/063* (2006.01)
*G11C 11/16* (2006.01)
*H01L 27/22* (2006.01)
*H01L 43/10* (2006.01)

(52) U.S. Cl.
CPC ............ *H01L 43/04* (2013.01); *G06N 3/063* (2013.01); *G11C 11/161* (2013.01); *G11C 11/1673* (2013.01); *G11C 11/1675* (2013.01); *G11C 11/1697* (2013.01); *H01L 27/228* (2013.01); *H01L 43/10* (2013.01)

(58) Field of Classification Search
CPC ....... H01L 43/04; H01L 27/228; H01L 43/10; G11C 11/161; G11C 11/1673; G11C 11/1675; G11C 11/1679
USPC ........................................................ 365/158
See application file for complete search history.

(56) References Cited

U.S. PATENT DOCUMENTS

| | | | | |
|---|---|---|---|---|
| 4,835,510 A | * | 5/1989 | Shibasaki | G01R 33/09 29/610.1 |
| 6,191,972 B1 | * | 2/2001 | Miura | G11C 11/1673 365/158 |
| 6,778,426 B2 | * | 8/2004 | Hosotani | G11C 13/0004 365/158 |

(Continued)

FOREIGN PATENT DOCUMENTS

JP      5441005 B2      3/2014
JP      2017-216286 A   12/2017

*Primary Examiner* — Viet Q Nguyen
(74) *Attorney, Agent, or Firm* — Oliff PLC

(57) ABSTRACT

A magnetic recording array according to the present embodiment includes a plurality of spin elements, a first reference cell, and a second reference cell, wherein the plurality of spin elements, the first reference cell, and the second reference cell each have a wiring and a stacked body including a first ferromagnetic layer stacked on the wiring, wherein the electrical resistance of the wiring of the first reference cell is higher than the electrical resistance of the wiring of each spin element, and wherein the electrical resistance of the wiring of the second reference cell is lower than the electrical resistance of the wiring of each spin element.

12 Claims, 11 Drawing Sheets

(56) References Cited

U.S. PATENT DOCUMENTS

| | | | |
|---|---|---|---|
| 8,009,466 B2* | 8/2011 | Sakimura | G11C 11/1675 |
| | | | 365/158 |
| 8,199,550 B2* | 6/2012 | Okayama | G11C 11/16 |
| | | | 365/158 |
| 10,585,630 B2* | 3/2020 | Rakshit | H01L 43/08 |
| 11,171,175 B2* | 11/2021 | Kai | H01L 43/08 |
| 11,217,288 B2* | 1/2022 | Sawada | G11C 11/161 |
| 2003/0031045 A1* | 2/2003 | Hosotani | G11C 11/1673 |
| | | | 365/158 |
| 2011/0129691 A1 | 6/2011 | Ishiwata et al. | |
| 2013/0028009 A1* | 1/2013 | Kim | G11C 11/16 |
| | | | 365/158 |
| 2015/0187393 A1* | 7/2015 | Ueda | G11C 13/0004 |
| | | | 365/72 |

* cited by examiner

MAGNETIC RECORDING ARRAY, NEUROMORPHIC DEVICE, AND METHOD OF CONTROLLING MAGNETIC RECORDING ARRAY

TECHNICAL FIELD

The present invention relates to a magnetic recording array, a neuromorphic device, and a method of controlling a magnetic recording array.

BACKGROUND ART

Next-generation non-volatile memories that will replace flash memories, and the like which have reached their limits in miniaturization are attracting attention. For example, a magnetoresistive random access memory (MRAM), a resistance random access memory (ReRAM), a phase change random access memory (PCRAM), and the like are known as next-generation non-volatile memories.

An MRAM is a memory cell using a magnetoresistance effect element. The resistance value of the magnetoresistance effect element changes due to a difference in relative angle of a magnetization direction between two magnetic films. The MRAM records the resistance value of the magnetoresistance effect element as data.

Among spin elements that utilize magnetic resistance change, a spin-orbit torque magnetoresistance effect element using a spin-orbit torque (SOT) (for example, Patent Document 1) and a magnetic domain wall movement type magnetic recording element using the movement of a magnetic domain wall (for example, Patent Document 2) are attracting attention.

CITATION LIST

Patent Literature

[Patent Document 1]
  Japanese Unexamined Patent Application, First Publication No. 2017-216286
[Patent Document 2]
  Japanese Patent No. 5441005

SUMMARY OF INVENTION

Technical Problem

A spin element records data with a resistance value, for example. The resistance value of the spin element fluctuates due to the temperature and deterioration. When the resistance value of the spin element drifts, a reference point that is a threshold value for data recording fluctuates, and the reliability of the data decreases.

In addition, spin elements are often integrated and used as a magnetic recording array. It is difficult to inspect each of a large number of spin elements during use, and it may not be possible to accurately determine the failure thereof.

The present invention has been made in view of the above problems, and an object of the present invention is to provide a magnetic recording array, a neuromorphic device, and a method of controlling a magnetic recording array with a high reliability of data.

Solution to Problem (1) A magnetic recording array according to a first aspect includes a plurality of spin elements, a first reference cell, and a second reference cell, wherein the plurality of spin elements, the first reference cell, and the second reference cell each have a wiring and a stacked body including a first ferromagnetic layer stacked on the wiring, wherein the electrical resistance of the wiring of the first reference cell is higher than the electrical resistance of the wiring of each spin element, and wherein the electrical resistance of the wiring of the second reference cell is lower than the electrical resistance of the wiring of each spin element.

(2) In the magnetic recording array according to the above aspect, the width of the wiring of the first reference cell may be narrower than a width of the wiring of the spin element, and the width of the wiring of the second reference cell may be wider than the width of the wiring of the spin element.

(3) In the magnetic recording array according to the above aspect, the thickness of the wiring of the first reference cell may be thinner than the thickness of the wiring of the spin element, and the thickness of the wiring of the second reference cell may be thicker than the thickness of the wiring of the spin element.

(4) In the magnetic recording array according to the above aspect, each wiring of the spin element, the first reference cell, and the second reference cell may be formed of the same material.

(5) In the magnetic recording array according to the above aspect, the electrical resistance of the wiring of the first reference cell may be 105% or more of the electrical resistance of the wiring of the spin element, and the electrical resistance of the wiring of the second reference cell may be 95% or less of the electrical resistance of the wiring of the spin element.

(6) The magnetic recording array according to the above aspect may further include a power supply that is configured to generate a potential difference in a length direction of each wiring of the plurality of spin elements, the first reference cell, and the second reference cell, wherein the power supply may apply the same voltage to each wiring of the plurality of spin elements, the first reference cell, and the second reference cell.

(7) In the magnetic recording array according to the above aspect, the stacked body may have the first ferromagnetic layer, a nonmagnetic layer, and a second ferromagnetic layer from close to the wiring, and the wiring may be any one of a metal, an alloy, an intermetallic compound, a metal boride, a metal carbide, a metal silicide, and a metal phosphate which have a function of generating a spin current due to a spin Hall effect when a current flows.

(8) In the magnetic recording array according to the above aspect, the stacked body may have a nonmagnetic layer and the first ferromagnetic layer from close to the wiring, and the wiring may be a ferromagnetic layer capable of having a magnetic domain wall inside.

(9) A neuromorphic device according to a second aspect includes the magnetic recording array according to the above aspect.

(10) A method of controlling a magnetic recording array according to a third aspect which is a method of controlling the magnetic recording array according to the above aspect, includes a step of applying the same write voltage to each wiring of a spin element that is a write target among the plurality of spin elements, the first reference cell, and the second reference cell; a step of applying a read voltage in a stacking direction of the spin element, the first reference cell, and the second reference cell to which the write voltage is applied; and a step of comparing the electrical resistance of the spin element with the electrical resistances of the first reference cell and the second reference cell.

(11) In the method of controlling a magnetic recording array according to the above aspect, when comparing the electrical resistance of the spin element with the electrical resistances of the first reference cell and the second reference cell, in a case in which the electrical resistance of the spin element is not between the electrical resistance of the first reference cell and the electrical resistance of the second reference cell, writing to the spin element may be prohibited.

(12) In the method of controlling a magnetic recording array according to the above aspect, when comparing the electrical resistance of the spin element with the electrical resistances of the first reference cell and the second reference cell, in a case in which the electrical resistance of the spin element is not between the electrical resistance of the first reference cell and the electrical resistance of the second reference cell, writing and reading of data to and from the spin element may be replaced with writing and reading of data to and from another element.

Advantageous Effects of Invention

The magnetic recording array, the neuromorphic device, and the method of controlling a magnetic recording array according to the above aspects have a high reliability of data.

DESCRIPTION OF EMBODIMENTS

Figure 1:
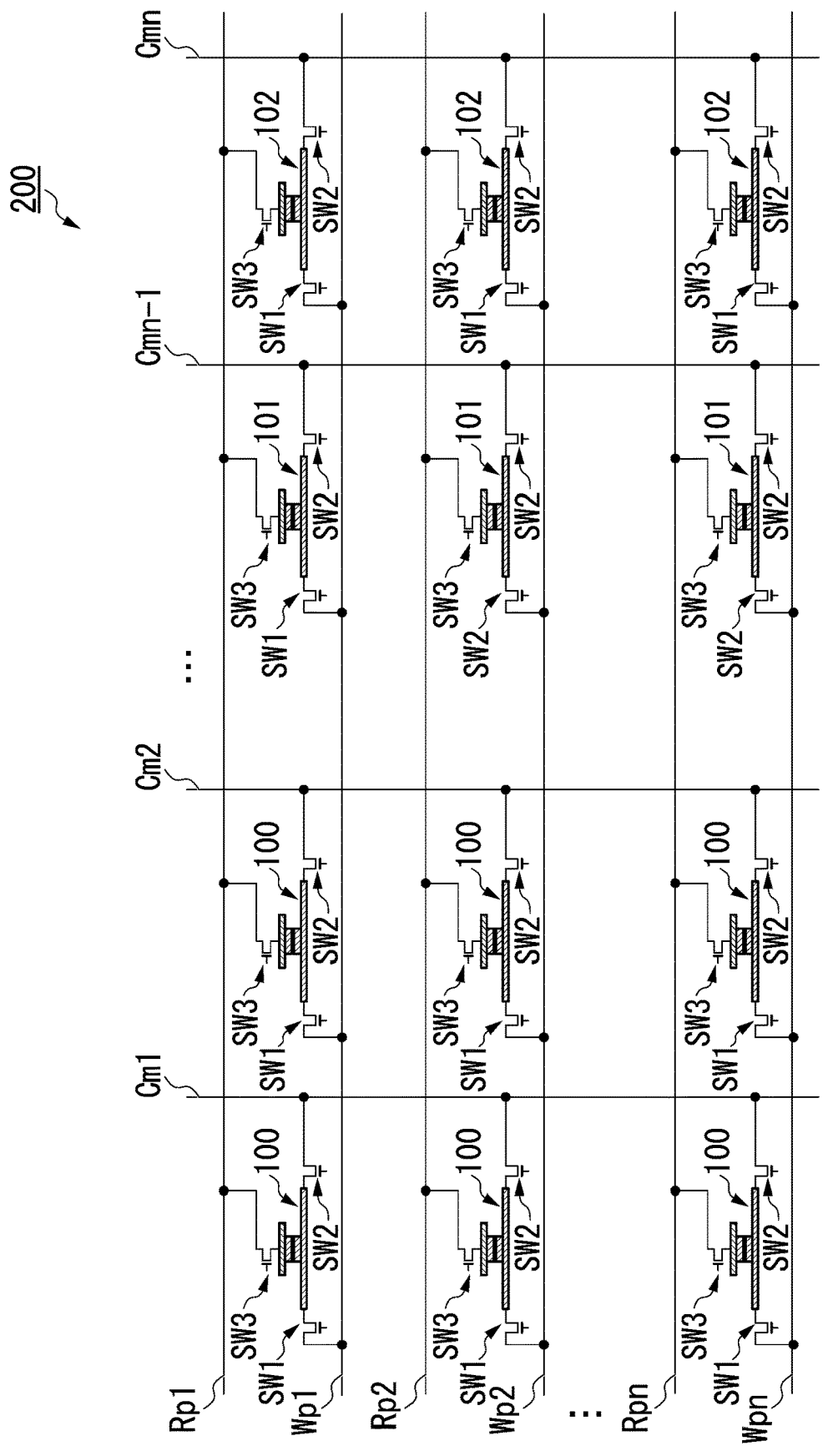
FIG. 1 is a schematic view of a magnetic recording array according to a first embodiment.

Hereinafter, the present embodiment will be described in detail with appropriate reference to the drawings. In the drawings used in the following description, a feature portion may be enlarged for convenience to make a feature easy to understand, and dimensional ratios of each constituent element and the like may be different from the actual ones. Materials, dimensions, and the like provided in the following description are exemplary examples, and the present invention is not limited thereto, and can be appropriately modified and carried out within the scope in which the effects of the present invention are exhibited.

First, directions are defined. One direction of one surface of a substrate Sub (see FIG. 2) that will be described later is defined as an x direction, and a direction orthogonal to the x direction is defined as a y direction. The x direction is a direction in which a wiring that will be described later extends, and is a length direction of the wiring. A z direction is a direction orthogonal to the x direction and the y direction. The z direction is an example of a stacking direction. Hereinafter, a +z direction may be expressed as an "upward direction" and a −z direction may be expressed as a "downward direction". The upward and downward directions do not always coincide with the direction in which gravity acts.

First Embodiment

FIG. 1 is a configuration view of a magnetic recording array 200 according to a first embodiment. The magnetic recording array 200 includes a plurality of magnetoresistance effect elements 100, a plurality of first reference cells 101, a plurality of second reference cells 102, a plurality of write wirings Wp1 to Wpn, and a plurality of common wirings Cm1 to Cmn, a plurality of read wirings Rp1 to Rpn, a plurality of first switching elements SW1, a plurality of second switching elements SW2, and a plurality of third switching elements SW3. The magnetic recording array 200 can be used for, for example, a magnetic memory. The magnetoresistance effect element 100 is an example of a spin element.

The magnetoresistance effect elements 100, the first reference cells 101, and the second reference cells 102 are arranged in, for example, a matrix. The first reference cell 101 and the second reference cell 102 are connected to, for example, each of the write wirings Wp1 to Wpn. The number of each of the first reference cells 101 and the second reference cells 102 is not limited to this case, and may be at least one for each magnetic recording array 200.

Each of the write wirings Wp1 to Wpn is a wiring used when writing data. The write wirings Wp1 to Wpn are each connected to, for example, the plurality of magnetoresistance effect elements 100, the first reference cell 101, and the second reference cell 102. The write wirings Wp1 to Wpn are connected to a power supply (not shown).

Each of the common wirings Cm1 to Cmn is a wiring used both when writing data and when reading data. The common wirings Cm1 to Cmn electrically connect, for example, a reference potential to the magnetoresistance effect elements 100, the first reference cells 101, or the second reference cells 102. The reference potential is, for example, the ground. The common wirings Cm1 to Cmn may be provided in each of the magnetoresistance effect element 100, the first reference cell 101, or the second reference cell 102, or may be provided over a plurality of elements and cells.

Each of the read wirings Rp1 to Rpn is a wiring used when reading data. The read wirings Rp1 to Rpn are each connected to, for example, the plurality of magnetoresistance effect elements 100, the first reference cell 101, and the second reference cell 102. The read wirings Rp1 to Rpn are connected to a power supply (not shown).

The first switching element SW1, the second switching element SW2, and the third switching element SW3 are connected to, for example, each of the magnetoresistance effect element 100, the first reference cell 101, and the second reference cell 102. The first switching element SW1 is located between each of the write wirings Wp1 to Wpn and the magnetoresistance effect element 100, the first reference cell 101, or the second reference cell 102. The second switching element SW2 is located between each of the common wirings Cm1 to Cmn and the magnetoresistance effect element 100, the first reference cell 101, or the second reference cell 102. The third switching element SW3 is located between each of the read wirings Rp1 to Rpn and the magnetoresistance effect element 100, the first reference cell 101, or the second reference cell 102.

When the first switching element SW1 and the second switching element SW2 are turned on, a write current flows between each of the write wirings Wp1 to Wpn and each of the common wirings Cm1 to Cmn which are connected to the predetermined magnetoresistance effect element 100, the first reference cell 101, and the second reference cell 102. When the second switching element SW2 and the third switching element SW3 are turned on, a read current flows between each of the common wirings Cm1 to Cmn and each of the read wirings Rp1 to Rpn which are connected to the predetermined magnetoresistance effect element 100, the first reference cell 101, and the second reference cell 102.

Each of the first switching element SW1, the second switching element SW2, and the third switching element SW3 is an element that controls the flow of the current. Each of the first switching element SW1, the second switching element SW2, and the third switching element SW3 is, for example, a transistor, an element using a phase change of a crystal layer such as an ovonic threshold switch (OTS), an element using a change in band structure such as a metal insulator transition (MIT) switch, an element using a breakdown voltage such as a Zener diode and an avalanche diode, and an element of which the conductivity changes as the atomic position changes.

Any one of the first switching element SW1, the second switching element SW2, and the third switching element SW3 may be shared as an element connected to the same wirings. For example, in a case in which the first switching element SW1 is shared, one first switching element SW1 is provided upstream of each of the write wirings Wp1 to Wpn. For example, in a case in which the second switching element SW2 is shared, one second switching element SW2 is provided upstream of each of the common wirings Cm1 to Cmn. For example, in a case in which the third switching element SW3 is shared, one third switching element SW3 is provided upstream of each of the read wirings Rp1 to Rpn.

Figure 2:
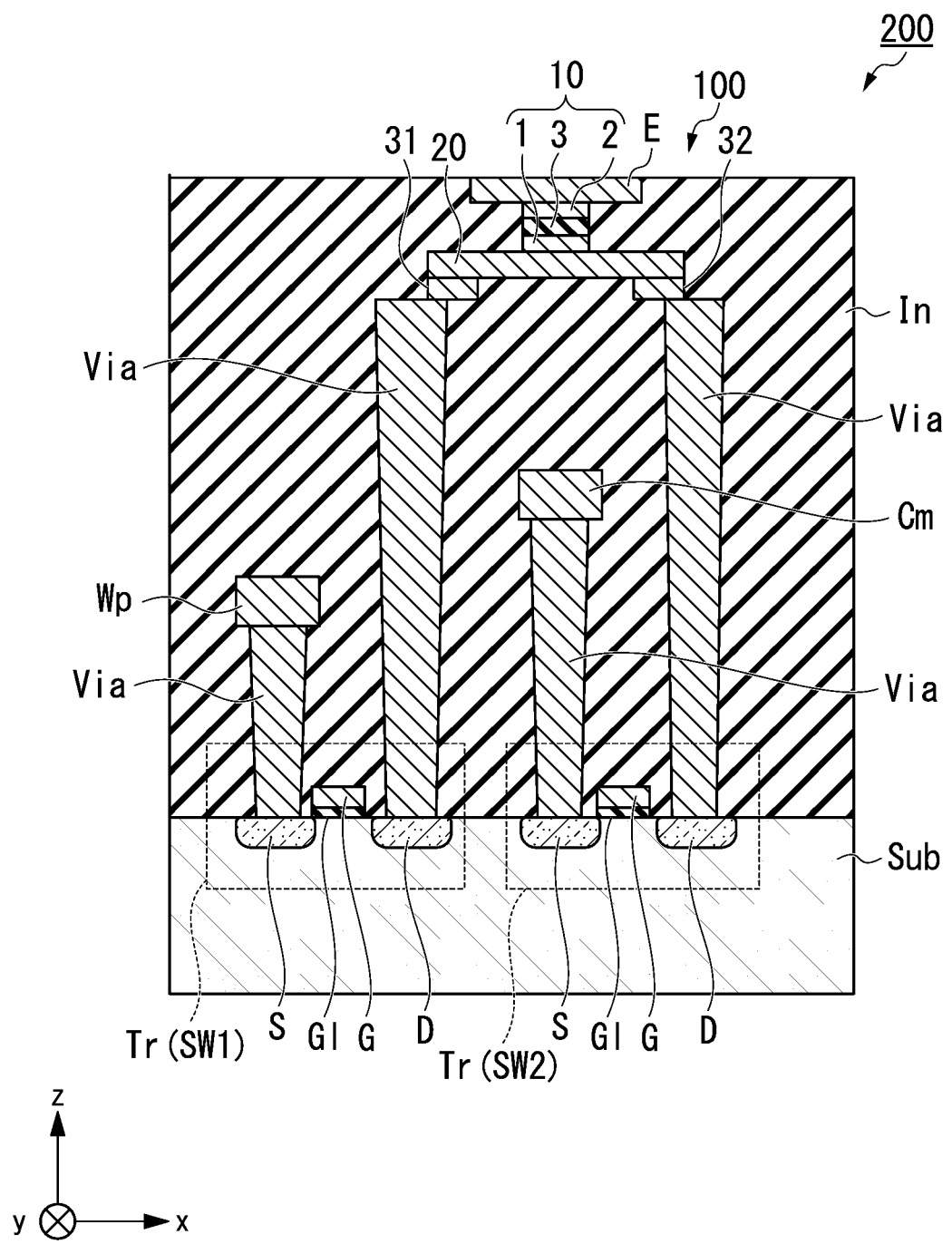
FIG. 2 is a cross-sectional view of a feature portion of the magnetic recording array according to the first embodiment.

FIG. 2 is a cross-sectional view of a main portion of the magnetic recording array 200 according to the first embodiment. FIG. 2 is a cross section of the magnetoresistance effect element 100 along an xz plane passing through the center of the width of a wiring 20 that will be described later in the y direction.

Each of the first switching element SW1 and the second switching element SW2 shown in FIG. 2 is a transistor Tr. The third switching element SW3 is electrically connected to an electrode E and is located, for example, in the y direction of FIG. 2. The transistor Tr is, for example, a field effect transistor, and has a gate electrode G, a gate insulating film GI, and a source S and a drain D which are formed on the substrate Sub. The substrate Sub is, for example, a semiconductor substrate.

The transistor Tr and the magnetoresistance effect element 100 are electrically connected to each other via conductive portions 31 and 32 and a via wiring Via. Further, the transistor Tr and the write wiring Wp or the common wiring Cm are connected with the via wiring Via. The via wiring Via extends, for example, in the z direction.

The periphery of the magnetoresistance effect element 100 and the transistor Tr is covered with an insulating layer In. The insulating layer In is an insulating layer that insulates a portion between the wirings of the multilayer wiring and a portion between the elements. The insulating layer In includes, for example, silicon oxide ($SiO_x$), silicon nitride ($SiN_x$), silicon carbide (SiC), chromium nitride, silicon carbonitride (SiCN), silicon oxynitride (SiON), and aluminum oxide ($Al_2O_3$), zirconium oxide ($ZrO_x$) and the like.

The structure of a cross section passing through each of the first reference cell 101 and the second reference cell 102 is substantially the same as the structure of the cross section of the magnetoresistance effect element 100.

Figure 3:
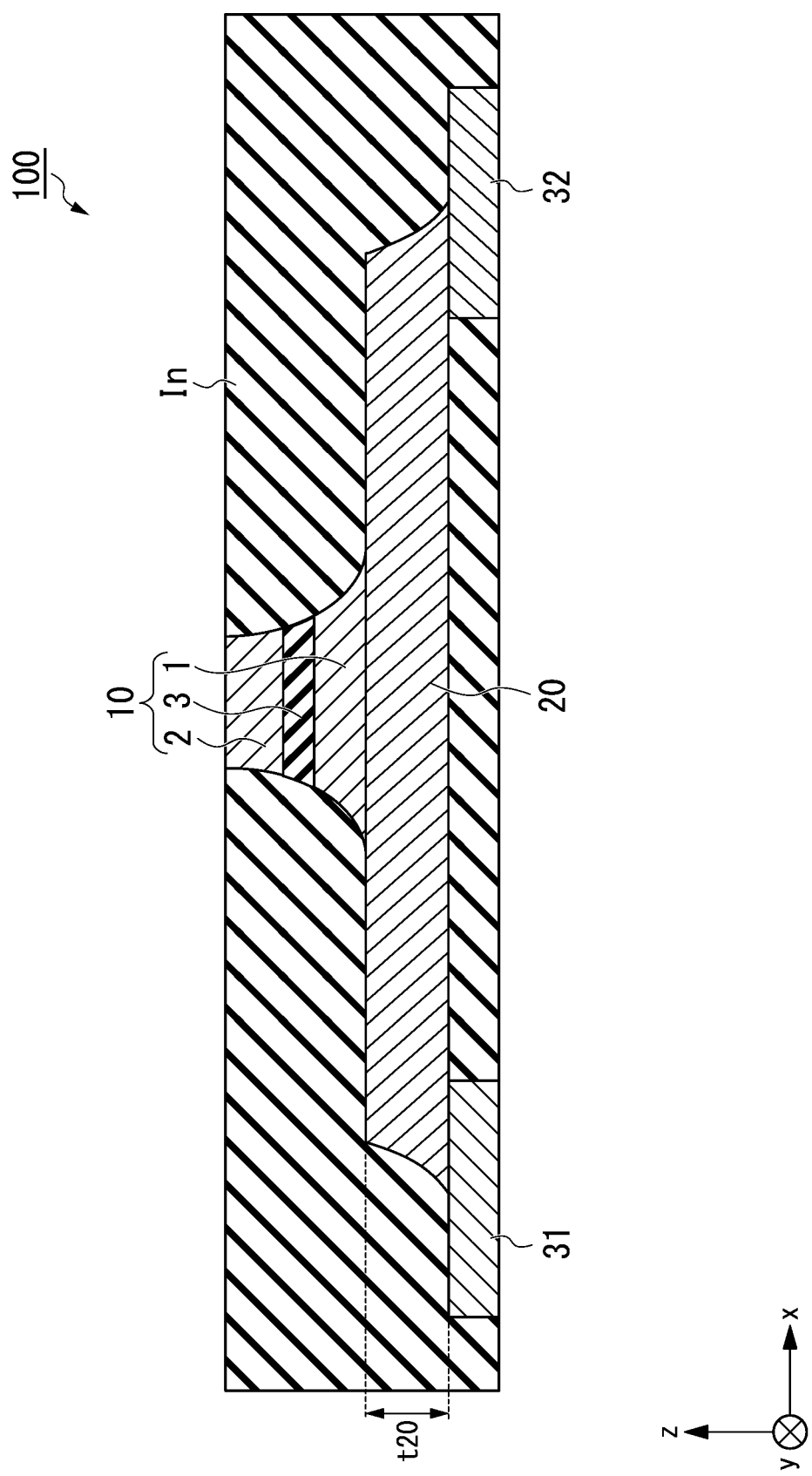
FIG. 3 is a cross-sectional view of a spin element according to the first embodiment.
Figure 4:
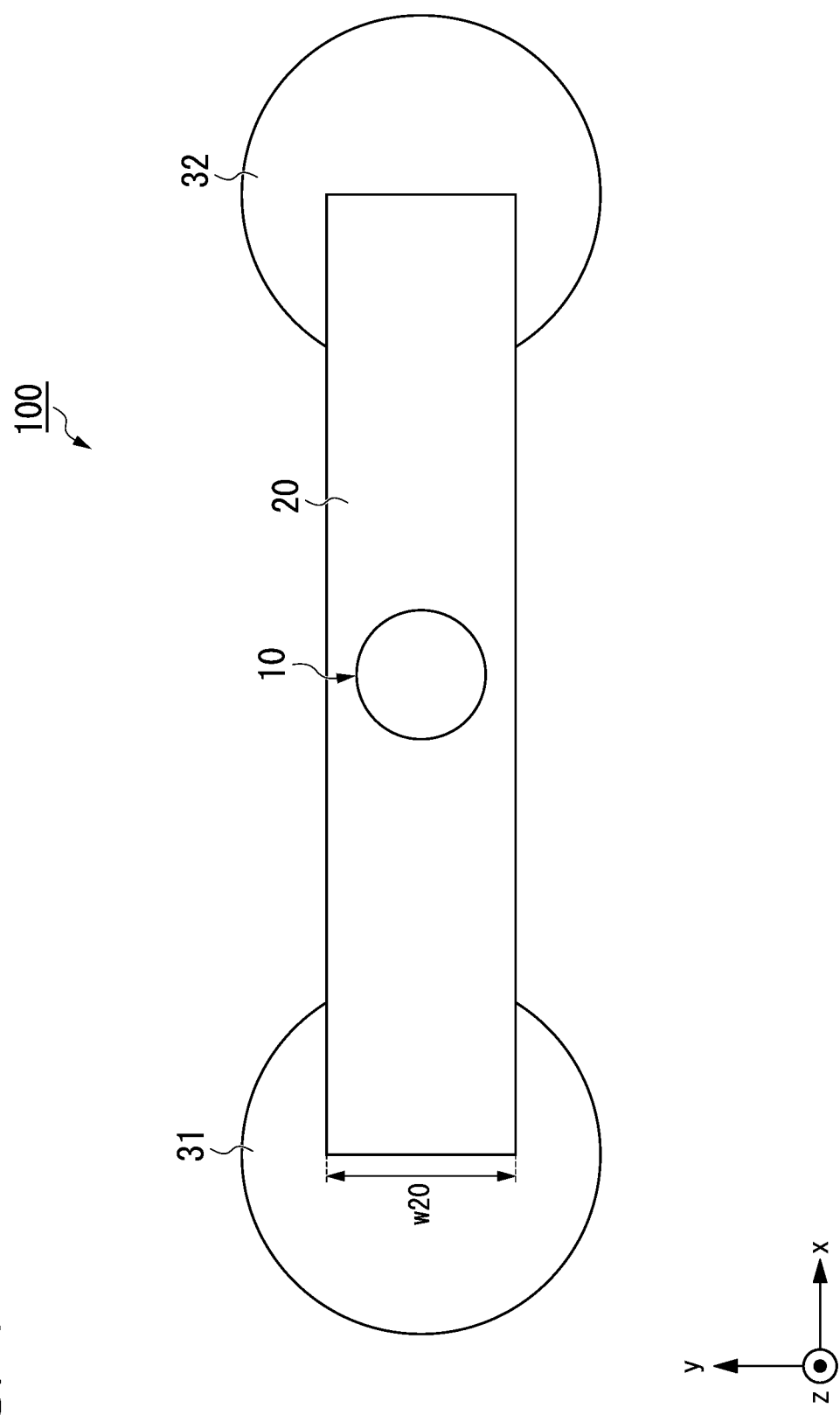
FIG. 4 is a plan view of the spin element according to the first embodiment.

FIG. 3 is a cross-sectional view of the magnetoresistance effect element 100 according to the first embodiment. FIG. 4 is a plan view of the magnetoresistance effect element 100 according to the first embodiment. FIG. 3 is a cross section of the magnetoresistance effect element 100 along an xz plane passing through the center of the width of a wiring 20 in the y direction.

The magnetoresistance effect element 100 includes, for example, a stacked body 10, the wiring 20, and the conductive portions 31 and 32. The resistance value of the laminated body 10 in the z direction changes when spins are injected from the wiring 20 into the stacked body 10. The magnetoresistance effect element 100 is a spin element using a spin-orbit torque (SOT), and may be referred to as a spin-orbit torque magnetoresistance effect element, a spin injection magnetoresistance effect element, or a spin current magnetoresistance effect element. Further, the wiring 20 may be referred to as a spin-orbit torque wiring.

The stacked body 10 is stacked on the wiring 20. Another layer may be provided between the stacked body 10 and the wiring 20. The stacked body 10 is interposed between the wiring 20 and the electrode E in the z direction. The stacked body 10 is a columnar body. The plan view shape of the stacked body 10 in the z direction is, for example, a circle, an ellipse, or a quadrilateral.

The stacked body 10 has a first ferromagnetic layer 1, a second ferromagnetic layer 2, and a nonmagnetic layer 3. The first ferromagnetic layer 1 is in contact with the wiring 20 and is stacked on the wiring 20, for example. The spins are injected into the first ferromagnetic layer 1 from the wiring 20. In the magnetization of the first ferromagnetic layer 1, the first ferromagnetic layer receives a spin-orbit torque (SOT) due to the injected spins, and an orientation direction thereof changes. The second ferromagnetic layer 2 is located in the z direction from the first ferromagnetic layer 1. The first ferromagnetic layer 1 and the second ferromagnetic layer 2 sandwich the nonmagnetic layer 3 therebetween in the z direction.

In the first ferromagnetic layer 1 and the second ferromagnetic layer 2, the magnetization is performed separately. The magnetization of the second ferromagnetic layer 2 is less likely to change in the orientation direction than the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. The resistance value of the stacked body 10 changes according to the difference in relative angle of magnetization between the first ferromagnetic layer 1 and the second ferromagnetic layer 2 with the nonmagnetic layer 3 interposed therebetween.

The first ferromagnetic layer 1 and the second ferromagnetic layer 2 contain a ferromagnetic material. The ferromagnetic material is, for example, a metal selected from the group consisting of Cr, Mn, Co, Fe, and Ni, an alloy containing one or more of these metals, an alloy containing these metals and at least one or more elements of B, C, and N, or the like. The ferromagnetic material is, for example, a Co—Fe alloy, a Co—Fe—B alloy, a Ni—Fe alloy, a Co—Ho alloy, a Sm—Fe alloy, an Fe—Pt alloy, a Co—Pt alloy, or a Co—Cr—Pt alloy.

The first ferromagnetic layer 1 and the second ferromagnetic layer 2 may contain a Heusler alloy. A Heusler alloy contains an intermetallic compound with an XYZ or $X_2YZ$ chemical composition. X is a transition metal element or noble metal element from the Co, Fe, Ni, or Cu groups in the periodic table, Y is a transition metal element from the Mn, V, Cr, or Ti groups in the periodic table or the same types of element as for X, and Z is a typical element from Groups III to V in the periodic table. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The stacked body 10 may have an antiferromagnetic layer on a surface of the second ferromagnetic layer 2 opposite to the nonmagnetic layer 3 via a spacer layer. The second ferromagnetic layer 2, the spacer layer, and the antiferromagnetic layer form a synthetic antiferromagnetic structure (an SAF structure). The synthetic antiferromagnetic structure is constituted by two magnetic layers with a nonmagnetic layer interposed therebetween. Antiferromagnetic coupling between the second ferromagnetic layer 2 and the antiferromagnetic layer increases a coercivity of the second ferromagnetic layer 2 as compared with a case without the antiferromagnetic layer. The antiferromagnetic layer is, for example, IrMn, PtMn, or the like. The spacer layer contains, for example, at least one selected from the group consisting of Ru, Ir, and Rh.

The stacked body 10 may have a layer other than the first ferromagnetic layer 1, the second ferromagnetic layer 2, and the nonmagnetic layer 3. For example, an underlayer may be provided between the wiring 20 and the stacked body 10. The underlayer enhances a crystallinity of each layer constituting the stacked body 10.

The wiring 20 is in contact with, for example, one surface of the stacked body 10. The wiring 20 is a write wiring for writing data to the magnetoresistance effect element 100. The wiring 20 extends in the x direction. At least a part of the wiring 20 together with the nonmagnetic layer 3 sandwiches the first ferromagnetic layer 1 in the z direction.

The wiring 20 generates a spin current due to a spin Hall effect when a current I flows, and injects spins into the first ferromagnetic layer 1. The wiring 20 provides, for example, a spin-orbit torque (SOT) sufficient to reverse the magnetization of the first ferromagnetic layer 1 for the magnetization of the first ferromagnetic layer 1. The spin Hall effect is a phenomenon in which a spin current is induced in a direction orthogonal to a direction in which a current flows, based on spin-orbit interaction when the current flows. The spin Hall effect is the same as a normal Hall effect in that a movement (traveling) direction of moving (traveling) charges (electrons) is bent. In the normal Hall effect, the movement direction of charged particles moving in a magnetic field is bent with a Lorentz force. On the other hand, in the spin Hall effect, even if a magnetic field is absent, the movement direction of the spins is bent only due to the movement of electrons (only due to the flowing current).

For example, when a current flows through the wiring 20, a first spin oriented in one direction and a second spin oriented in a direction opposite to the first spin are each bent in a direction orthogonal to a direction in which each current I flows due to the spin Hall effect. For example, the first spin oriented in a −y direction is bent in the +z direction, and the second spin oriented in a +y direction is bent in the −z direction.

In a nonmagnetic material (a material that is not a ferromagnetic material), the number of electrons in the first spin and the number of electrons in the second spin which are generated by the spin Hall effect are equal to each other. That is, the number of electrons in the first spin in the +z direction is equal to the number of electrons in the second spin in the −z direction. The first spin and the second spin flow in a direction of eliminating uneven distribution of the spins. In the movement of the first spin and the second spin in the z direction, the flows of the charges cancel each other out, so that the amount of the current becomes zero. A spin current without a current is particularly referred to as a pure spin current.

When the flow of electrons in the first spin is represented as $J_\uparrow$, the flow of electrons in the second spin is represented as $J_\downarrow$, and the spin current is represented as $J_S$, $J_S=J_\uparrow-J_\downarrow$ is defined. The spin current $J_S$ is generated in the z direction. The first spin is injected from the wiring 20 into the first ferromagnetic layer 1.

The wiring 20 contains any one of a metal, an alloy, an intermetallic compound, a metal boride, a metal carbide, a metal silicide, and a metal phosphate which have a function of generating a spin current due to the spin Hall effect when the current I flows.

The wiring 20 contains, for example, a nonmagnetic heavy metal as a main element. The main element is an element having the highest proportion among the elements constituting the wiring 20. The wiring 20 contains, for example, a heavy metal having a specific gravity of yttrium (Y) or more. Since the nonmagnetic heavy metal has a large atomic number of 39 or more and has d-electrons or f-electrons in the outermost shell, the spin-orbit interaction is strongly generated. The spin Hall effect is caused by the spin-orbit interaction, and the spins are likely to be unevenly distributed in the wiring 20, and the spin current $J_S$ is likely to be generated. The wiring 20 contains, for example, any one selected from the group consisting of Au, Hf, Mo, Pt, W, and Ta.

The wiring 20 may contain a magnetic metal. The magnetic metal is a ferromagnetic metal or an antiferromagnetic metal. A trace amount of the magnetic metal contained in the nonmagnetic material becomes a scattering factor of spins. The trace amount is, for example, 3% or less of the total of molar ratios of the elements constituting the wiring 20. When the spins are scattered by the magnetic metal, the spin-orbit interaction is enhanced, and the efficiency of the spin current generation with respect to the current increases.

The wiring 20 may include a topological insulator. A topological insulator is a material in which the interior of the material is an insulator or a high resistance body and a spin-polarized metal state is generated on its surface. In a topological insulator, an internal magnetic field is generated due to the spin-orbit interaction. In a topological insulator, a new topological phase develops due to the effect of the spin-orbit interaction even in the case where there is no external magnetic field. A topological insulator can generate a pure spin current with high efficiency due to a strong spin-orbit interaction and breaking of inversion symmetry at an edge.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. The topological insulator can generate spin currents with high efficiency.

The conductive portion 31 and the conductive portion 32 sandwich the stacked body 10 in the x direction in a plan view in the z direction. The conductive portions 31 and 32 electrically connect elements (or cells) or wirings in different layers, for example. The conductive portions 31 and 32 are formed of a material having an excellent conductivity. The conductive portions 31 and 32 include, for example, any one selected from the group consisting of Ag, Cu, Co, Al, and Au.

Figure 5:
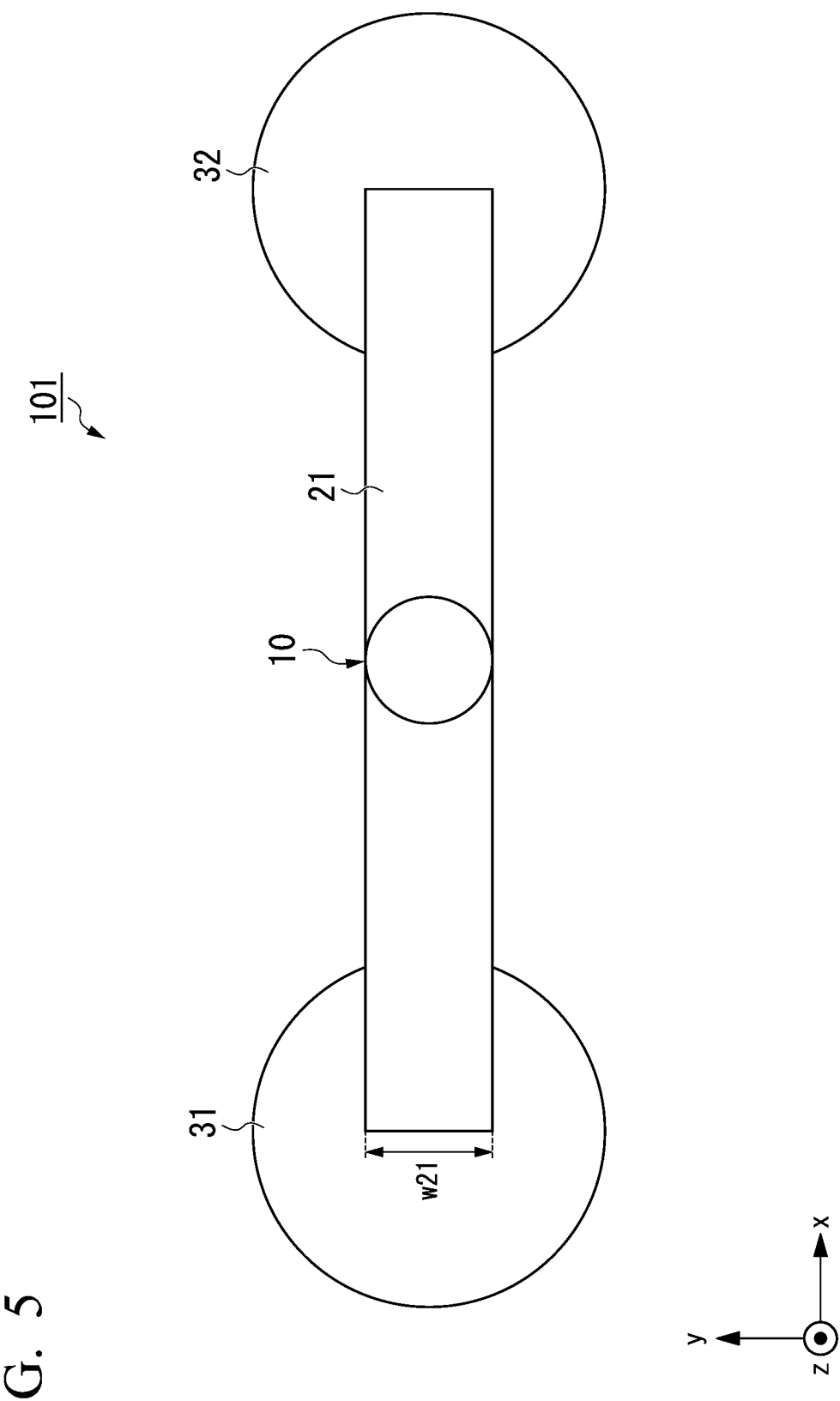
FIG. 5 is a plan view of a first reference cell according to the first embodiment.

FIG. 5 is a plan view of the first reference cell 101 according to the first embodiment. The first reference cell 101 includes, for example, the stacked body 10, a wiring 21, and the conductive portions 31 and 32. The first reference cell 101 has the same configuration as the magnetoresistance effect element 100 except that a wiring width w21 of the wiring 21 is narrower than a wiring width w20 of the wiring 20 of the magnetoresistance effect element 100.

The wiring width w21 of the wiring 21 is narrower than the wiring width w20 of the wiring 20. The wiring width w21 is, for example, 95% or less of the wiring width w20, and may be 90% or less of the wiring width w20. The wiring width w20 is the average value of the wiring widths of the plurality of magnetoresistance effect elements 100 in the y direction. If the wiring width w21 is sufficiently narrow, the wiring width w21 is sufficiently narrower than the wiring width w20 even if manufacturing variations are taken into consideration.

The wiring 21 is formed of, for example, the same material as the wiring 20. The electrical resistance of the wiring 21 is higher than the electrical resistance of the wiring 20. The electric resistance of the wiring 21 is, for example, 105% or more of the electric resistance of the wiring 20, and may be 110% or more of the electric resistance of the wiring 20. The electrical resistance of the wiring 20 is an average value of the electrical resistances of the wirings 20 of the plurality of magnetoresistance effect elements 100.

Figure 6:
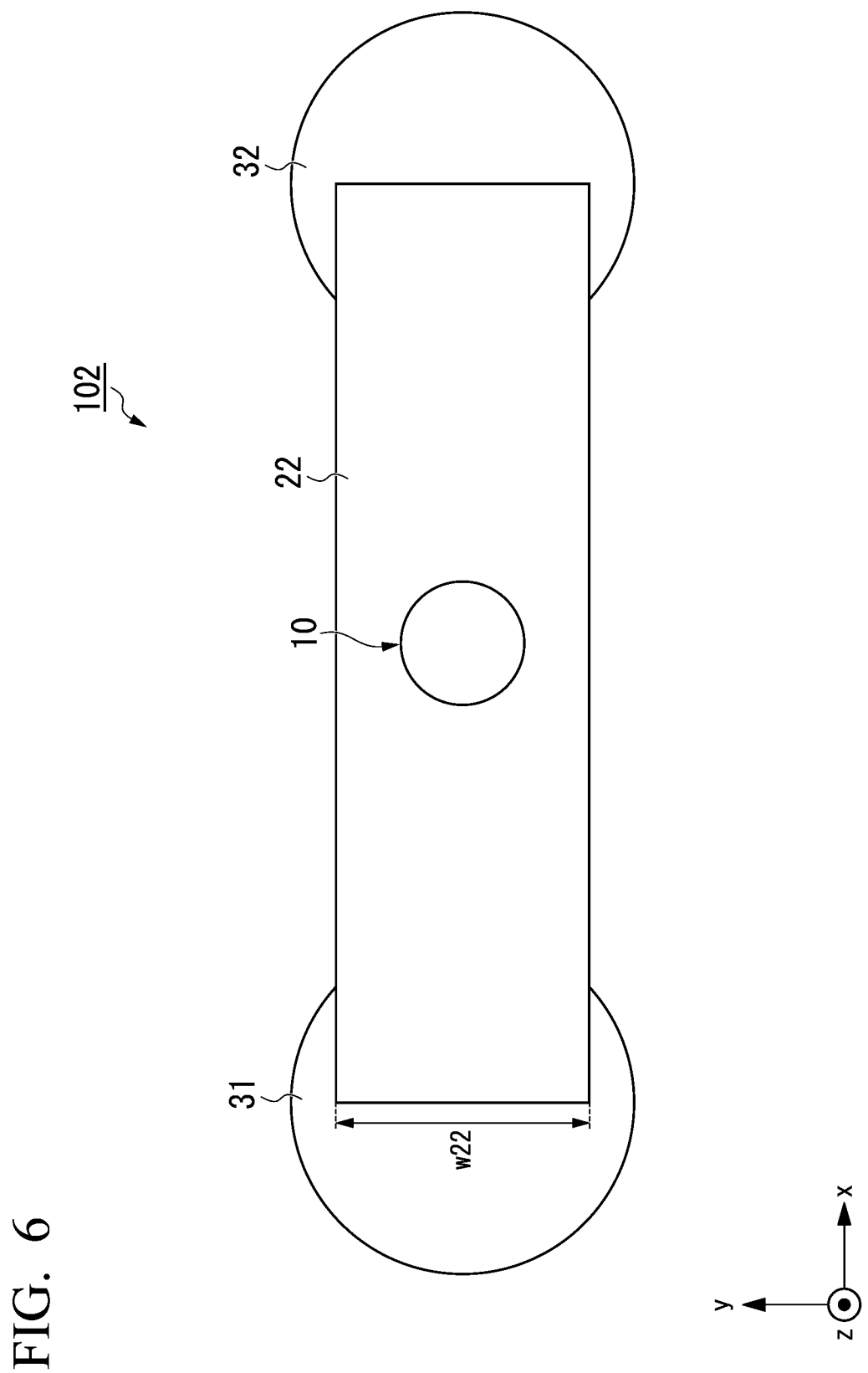
FIG. 6 is a plan view of a second reference cell according to the first embodiment.

FIG. 6 is a plan view of the second reference cell 102 according to the first embodiment. The second reference cell 102 includes, for example, the stacked body 10, a wiring 22, and the conductive portions 31 and 32. The second reference cell 102 has the same configuration as the magnetoresistance effect element 100 except that a wiring width w22 of the wiring 22 is wider than a wiring width w20 of the wiring 20 of the magnetoresistance effect element 100.

The wiring width w22 of the wiring 22 is wider than the wiring width w20 of the wiring 20. The wiring width w22 is, for example, 105% or more of the wiring width w20, and may be 110% or more of the wiring width w20. If the wiring width w22 is sufficiently wide, the wiring width w22 is sufficiently wider than the wiring width w20 even if manufacturing variations are taken into consideration.

The wiring 22 is formed of, for example, the same material as the wiring 20. The electrical resistance of the wiring 22 is lower than the electrical resistance of the wiring 20. The electric resistance of the wiring 22 is, for example, 95% or less of the electric resistance of the wiring 20, and may be 90% or less of the electric resistance of the wiring 20.

Next, a method of manufacturing the magnetoresistance effect element 100 will be described. The magnetoresistance effect element 100 is formed by a stacking step of each layer and a processing step of processing a part of each layer into a predetermined shape. For the stacking of each layer, a sputtering method, a chemical vapor deposition (CVD) method, an electron beam vapor deposition method (an EB vapor deposition method), an atomic laser deposit method, or the like can be used. The processing of each layer can be performed using photolithography or the like.

First, impurities are doped at a predetermined position on the substrate Sub to form the source S and the drain D. Next, the gate insulating film GI and the gate electrode G are formed between the source S and the drain D. The source S, the drain D, the gate insulating film GI, and the gate electrode G form the transistor Tr.

Next, the insulating layer In is formed to cover the transistor Tr. Further, by forming an opening in the insulating layer In and filling the opening with a conductive material, the via wiring Via and the conductive portions 31 and 32 are formed. The write wiring Wp and the common wiring Cm are formed by stacking the insulating layer In to a predetermined thickness, forming a groove in the insulating layer in, and filling the groove with a conductive material.

Next, the wiring layer, the ferromagnetic layer, the nonmagnetic layer, and the ferromagnetic layer are laminated in this order on the surfaces of the insulating layer In and the conductive portions 31 and 32. Next, the wiring layer is processed into a predetermined shape. The wiring layer is processed into a predetermined shape to form the wirings 20, 21, and 22. Next, the magnetoresistance effect element 100, the first reference cell 101, and the second reference cell 102 can be manufactured by processing the stacked body formed on the wiring layer into a predetermined shape to form the stacked body 10.

Figure 7:
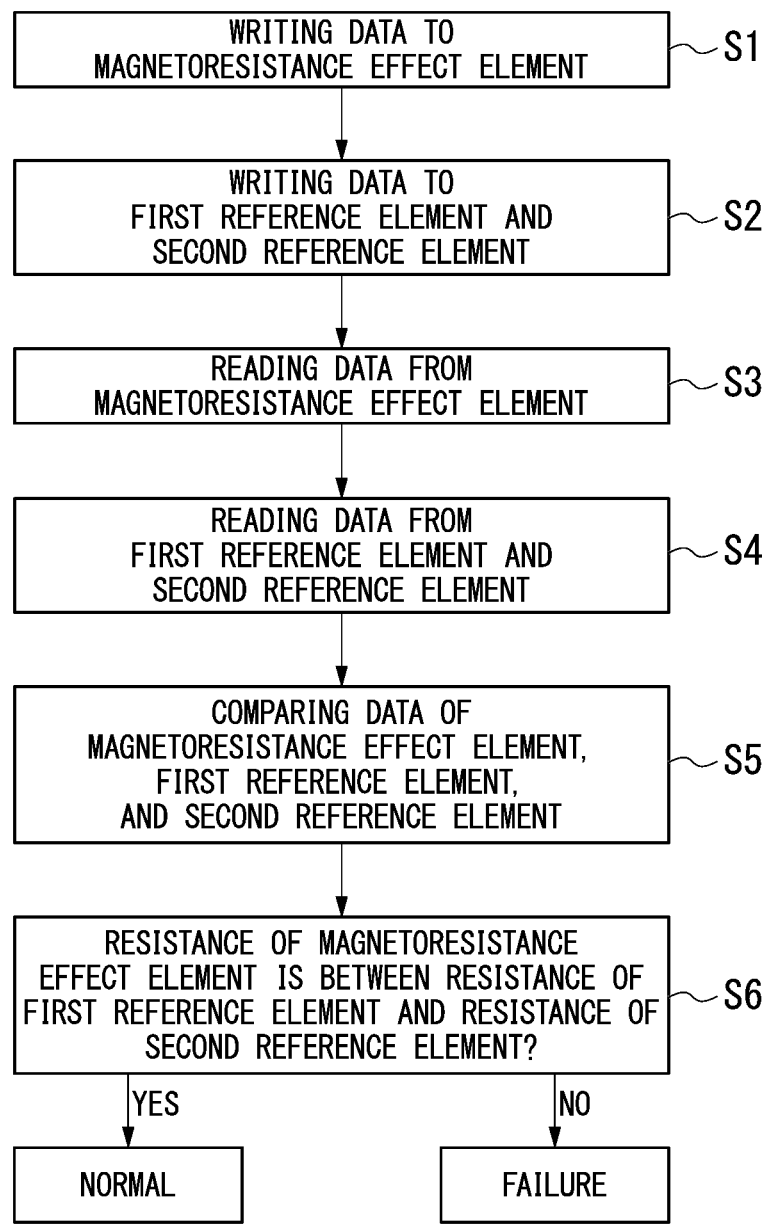
FIG. 7 is a flowchart of an example of an operation of the magnetic recording array according to the first embodiment.

Next, an operation and a control method of the magnetic recording array 200 according to the first embodiment will be described. FIG. 7 is a flowchart of an example of an operation of the magnetic recording array 200 according to the first embodiment.

First, a write operation is performed on the magnetoresistance effect element 100 that records data (step S1). The first switching element SW1 and the second switching element SW2 connected to the magnetoresistance effect element 100 for recording data are turned on. When the first switching element SW1 and the second switching element SW2 are turned on, a potential difference occurs in the length direction of the wiring 20, and a write current flows. When a write current flows through the wiring 20, a spin Hall effect occurs, and spins are injected into the first ferromagnetic layer 1. Due to the spins injected into the first ferromagnetic layer 1, a spin-orbital torque (SOT) is added for the magnetization of the first ferromagnetic layer 1 and a magnetization orientation direction of the first ferromagnetic layer 1 is changed. When the current flow direction is reversed, the direction of the spins injected into the first ferromagnetic layer 1 is reversed, so that the magnetization orientation direction can be freely controlled.

The resistance value of the stacked body 10 in the stacking direction is small in a case in which the magnetization of the first ferromagnetic layer 1 and the magnetization of the second ferromagnetic layer 2 are parallel, and is large in a case in which the magnetization of the first ferromagnetic layer 1 and the magnetization of the second ferromagnetic layer 2 is antiparallel. Data is recorded in the magnetoresistance effect element 100 as the resistance value of the stacked body 10 in the stacking direction.

In a case in which the write operation is performed on the magnetoresistance effect element 100, the same write operation is also performed on the first reference cell 101 and the second reference cell 102 paired with the magnetoresistance effect element 100 (step S2). The first reference cell 101 and the second reference cell 102 paired with the magnetoresistance effect element 100 are, for example, the first reference cell 101 and the second reference cell 102 connected to the same write wirings Wp1 to Wpn as the magnetoresistance effect element 100. The voltage which is applied to the wirings 21 and 22 of the first reference cell 101 and the second reference cell 102 is the same as that of the magnetoresistance effect element 100. The same load as that of the magnetoresistance effect element 100 is applied to the first reference cell 101 and the second reference cell.

Next, it is checked whether the magnetoresistance effect element 100 is operating properly. The operation checking of the magnetoresistance effect element 100 is performed by reading data from each of the elements on which the write operation has been performed and comparing the respective data.

The data of the magnetoresistance effect element 100 to which the data is written is read (step S3). The second switching element SW2 and the third switching element SW3 connected to the magnetoresistance effect element 100 for reading data are turned on. When the second switching element SW2 and the third switching element SW3 are turned on, a potential difference occurs in the stacking direction of the stacked body 10, and a read current flows. When a read current flows through the stacked body 10, the resistance value of the magnetoresistance effect element 100 in the stacking direction can be obtained from Ohm's law.

The same operation is performed on the first reference cell 101 and the second reference cell 102 (step S4). The resistance values of the first reference cell 101 and the second reference cell 102 in the stacking direction are read as data.

Next, the resistance values of the magnetoresistance effect element 100, the first reference cell 101, and the second reference cell 102 are compared (step S5). The resistance value is, for example, an electrical resistance between the electrode E and the conductive portion 32. The electrical resistance of the wiring 21 is higher than the electrical resistance of the wiring 20. Therefore, in a case in which the operation is properly performed, the electrical resistance of the first reference cell 101 is higher than the electrical resistance of the magnetoresistance effect element 100. Further, the electrical resistance of the wiring 22 is lower than the electrical resistance of the wiring 20. Therefore, in a case in which the operation is properly performed, the electrical resistance of the second reference cell 102 is lower than the electrical resistance of the magnetoresistance effect element 100.

Finally, the state of the magnetoresistance effect element 100 is determined based on the comparison result (step S6). In a case in which the electrical resistance of the magnetoresistance effect element 100 is between the electrical resistance of the first reference cell 101 and the electrical resistance of the second reference cell 102, it is determined that the magnetoresistance effect element 100 is operating normally. On the other hand, in a case in which the electrical resistance of the magnetoresistance effect element 100 is not between the electrical resistance of the first reference cell 101 and the electrical resistance of the second reference cell 102, it is determined that the magnetoresistance effect element 100 has failed.

One aspect of a failure of the magnetoresistance effect element 100 is deterioration or breakage of the wiring 20 between the stacked body 10 and the conductive portions 31 and 32. If the wiring 20 deteriorates or breaks, a proper write operation cannot be performed. For example, in the case of the magnetoresistance effect element 100 shown in FIG. 3, when the wiring 20 between the stacked body 10 and the conductive portion 31 deteriorates or breaks, the write operation cannot be performed, but the read operation can be performed. This is because the write current flowing between the conductive portion 31 and the conductive portion 32 does not normally flow, but the read current between the stacked body 10 and the conductive portion 32 flows normally. In this case, data is read without noticing that data is not written, and the risk of erroneous reading of data increases.

On the other hand, when the resistance value of the magnetoresistance effect element 100 is compared with those of the first reference cell 101 and the second reference cell 102, the risk of erroneous reading of data decreases. This is because even in a case in which deterioration or breakage occurs in a portion other than a read path of the magnetoresistance effect element 100, the electrical resistance of the magnetoresistance effect element 100 is affected. By comparing the electrical resistance of the magnetoresistance effect element 100 with the electrical resistances of the first reference cell 101 and the second reference cell 102, it is possible to appropriately detect an abnormality in the magnetoresistance effect element 100.

The magnetoresistance effect element 100 determined to be a failure is read-only or unusable in the subsequent operation.

In a case in which the magnetoresistance effect element 100 is read-only, the write operation to the magnetoresistance effect element 100 is prohibited. The magnetoresistance effect element 100 always outputs the same data. The magnetoresistance effect element 100 to which the write operation is prohibited can be used, for example, as a reference point at which data does not change.

In a case in which the magnetoresistance effect element 100 is unusable, the write and read operations to and from the magnetoresistance effect element 100 are prohibited. In the subsequent operation, the writing and reading of data to and from the unusable magnetoresistance effect element 100 are replaced with the writing and reading of data to and from another magnetoresistance effect element 100. Here, replacing with the writing and reading of data to and from another magnetoresistance effect element 100 does not mean removing the unusable magnetoresistance effect element 100 and replacing it with another element, but means replacing the writing and reading of data to and from the unusable magnetoresistance effect element 100 with the writing and reading of data to and from another magnetoresistance effect element 100 on a system.

As described above, in the magnetic recording array 200 according to the present embodiment, by comparing the electric resistances of the first reference cell 101 and the second reference cell 102 with the electric resistance of the magnetoresistance effect element 100, it is possible to evaluate the presence or absence of a failure of the magnetoresistance effect element 100 in real time.

Further, since the first reference cell 101 and the second reference cell 102 are in the same temperature environment as the magnetoresistance effect element 100, it is possible to prevent the reference point that is a threshold value for data recording from fluctuating due to a temperature change. Furthermore, since the first reference cell 101 and the second reference cell 102 are subjected to the same load as the magnetoresistance effect element 100, it is possible to prevent the reference point that is a threshold value for data recording from fluctuating due to deterioration.

Therefore, the magnetic recording array 200 according to the present embodiment has a low risk of erroneous reading of data and a high reliability.

So far, an example of the first embodiment has been illustrated, but the present invention is not limited thereto.

For example, in the above embodiment, a difference in electrical resistance among the wirings 20, 21, and 22 is realized by the wiring widths w20, w21, and w22, but the difference in electrical resistance may be generated by means other than the wiring widths w20, w21, and w22.

Figure 8:
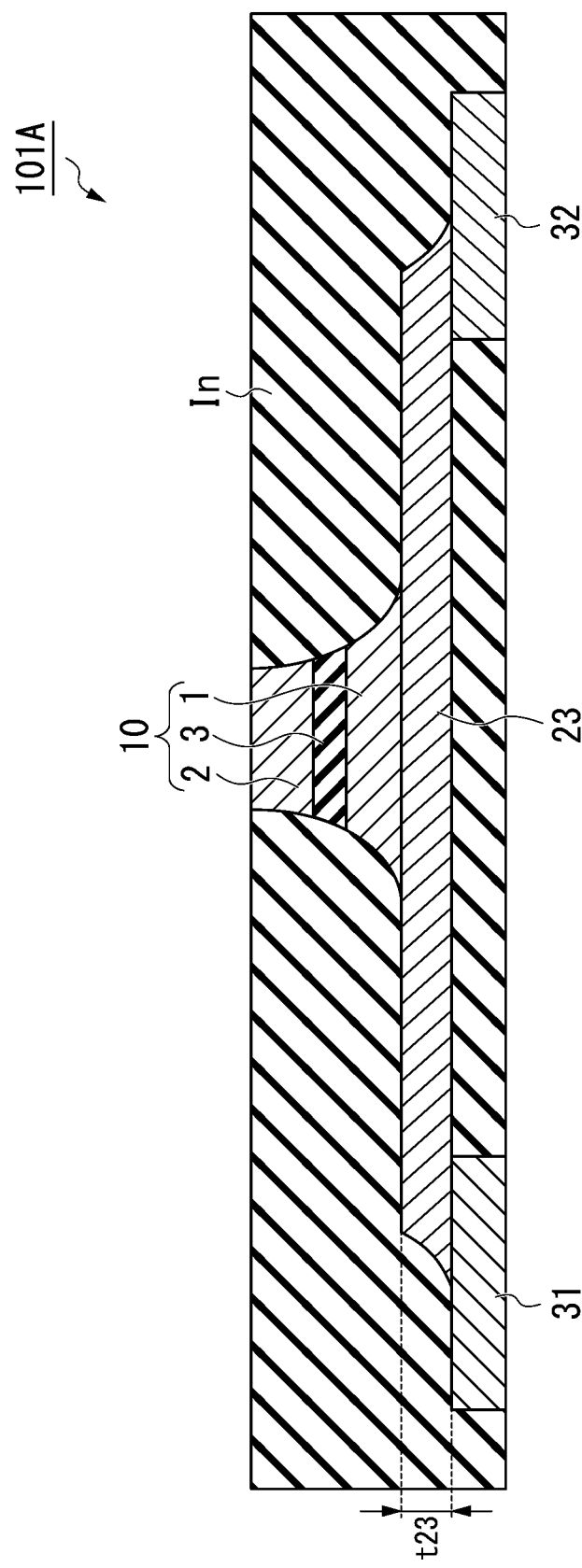
FIG. 8 is a cross-sectional view of a first reference cell according to a first modification example.
Figure 9:
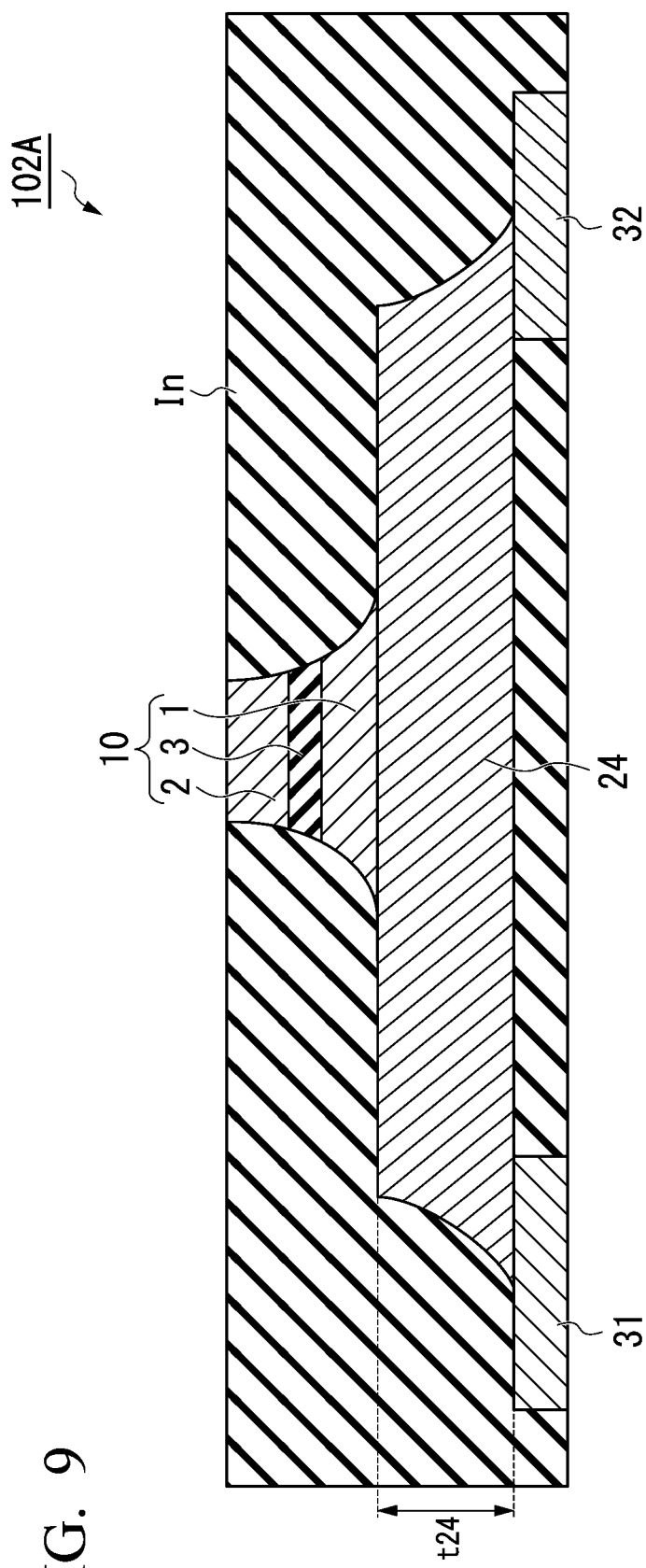
FIG. 9 is a cross-sectional view of a second reference cell according to a first modification example.

FIG. 8 is a cross-sectional view of a first reference cell 101A according to a first modification example. FIG. 9 is a cross-sectional view of a second reference cell 102A according to a first modification example. The first reference cell 101A includes, for example, the stacked body 10, a wiring 23, and the conductive portions 31 and 32. The second reference cell 102A includes, for example, the stacked body 10, a wiring 24, and the conductive portions 31 and 32. The first reference cell 101A and the second reference cell 102A have the same configuration as the magnetoresistance effect element 100, except that thicknesses t23 and t24 of the wirings 23 and 24 are different from a thickness t20 of the wiring 20 of the magnetoresistance effect element 100.

The thickness t23 of the wiring 23 is thinner than the thickness t20 of the wiring 20. The thickness t23 is, for example, 95% or less of the thickness t20, and may be 90% or less of the thickness t20. If the thickness t23 is sufficiently thin, the thickness t23 is sufficiently thinner than the thickness t20 even if manufacturing variations are taken into consideration.

The wiring 23 is formed of, for example, the same material as the wiring 20. The electrical resistance of the wiring 23 is higher than the electrical resistance of the wiring 20. The electric resistance of the wiring 23 is, for example, 105% or more of the electric resistance of the wiring 20, and may be 110% or more of the electric resistance of the wiring 20.

The thickness t24 of the wiring 24 is thicker than the thickness t20 of the wiring 20. The thickness t24 is, for example, 105% or more of the thickness t20, and may be 110% or more of the thickness t20. If the thickness t24 is sufficiently thick, the thickness t24 is sufficiently thicker than the thickness t20 even if manufacturing variations are taken into consideration.

The wiring 24 is formed of, for example, the same material as the wiring 20. The electrical resistance of the wiring 24 is lower than the electrical resistance of the wiring 20. The electric resistance of the wiring 24 is, for example, 95% or less of the electric resistance of the wiring 20, and may be 90% or less of the electric resistance of the wiring 20.

Further, by changing the material of each wiring of the magnetoresistance effect element, the first reference cell, and the second reference cell, the electrical resistance of each wiring may be changed. Further, the electrical resistance of each wiring may be changed by combining parameters of the wiring width, the thickness, and the material.

Second Embodiment

Figure 10:
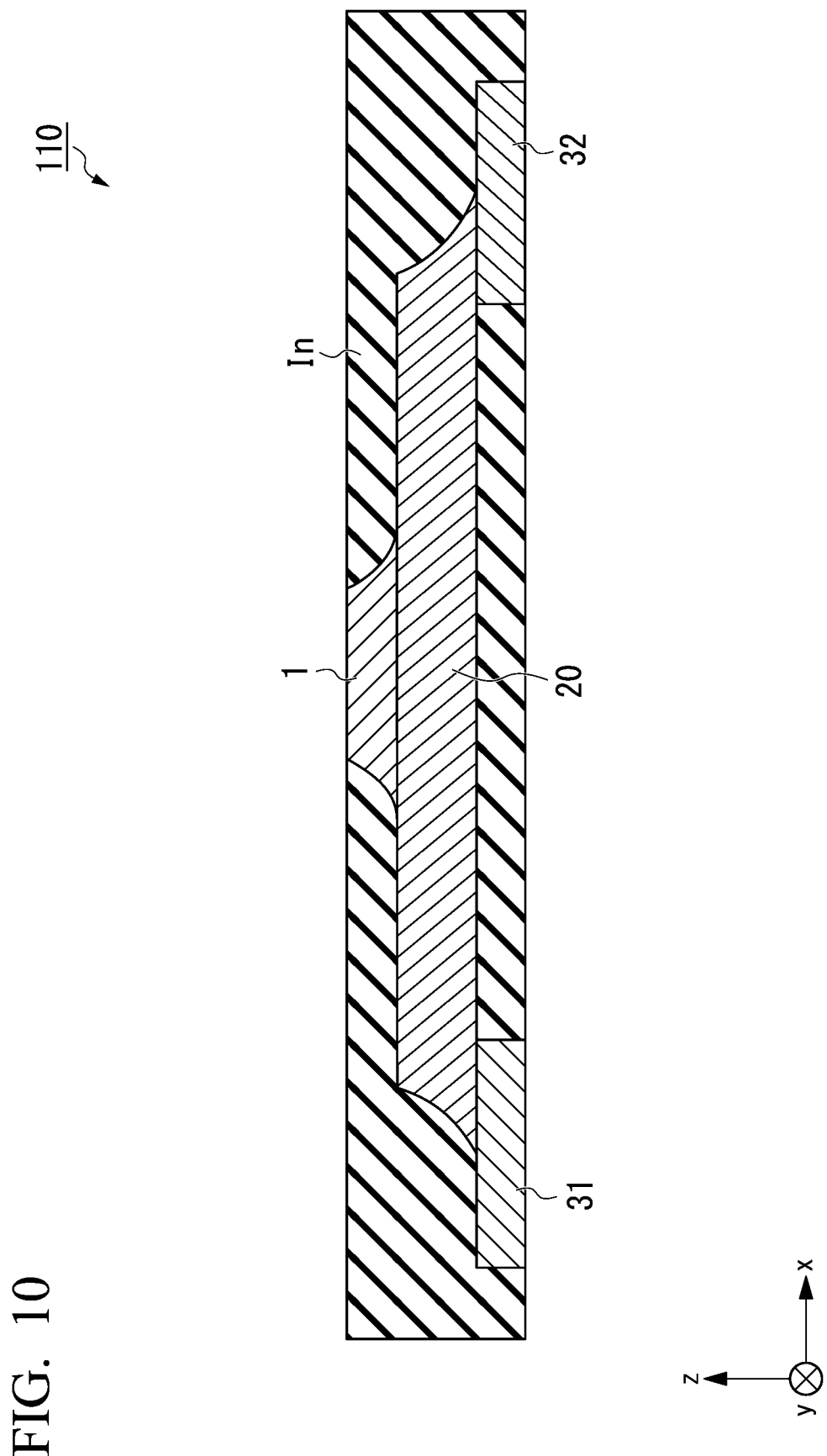
FIG. 10 is a cross-sectional view of a spin element according to a second embodiment.

FIG. 10 is a cross-sectional view of a magnetization rotation element 110 according to a second embodiment. FIG. 10 is a cross section of the magnetization rotation element 110 along an xz plane passing through the center of the width of the wiring 20 in the y direction. The magnetization rotation element 110 according to the second embodiment is different from the magnetoresistance effect element 100 according to the first embodiment in that it does not have the nonmagnetic layer 3 and the second ferromagnetic layer 2. Other constituent elements are the same as those of the magnetoresistance effect element 100 according to the first embodiment, and a description thereof will be omitted.

The magnetization rotation element 110 is an example of a spin element. The magnetization rotation element 110 inputs light on the first ferromagnetic layer 1 and evaluates light reflected by the first ferromagnetic layer 1, for example. When the magnetization orientation direction changes due to a magnetic Kerr effect, a deflection state of the reflected light changes. The magnetization rotation element 110 can be used, for example, as an optical element such as an image display device that utilizes a difference in deflection state of light.

In addition, the magnetization rotation element 110 can be used alone as an anisotropic magnetic sensor, an optical element that utilizes a magnetic Faraday effect, and the like.

The first reference cell and the second reference cell in the second embodiment have the same configuration as the magnetization rotation element 110 except for the electrical resistance of the wiring.

In the magnetization rotation element 110 according to the second embodiment, only the nonmagnetic layer 3 and the second ferromagnetic layer 2 are removed, and the same effect as the magnetoresistance effect element 100 according to the first embodiment can be obtained. Further, the same modification example as the magnetoresistance effect element 100 according to the first embodiment can be selected.

Third Embodiment

Figure 11:
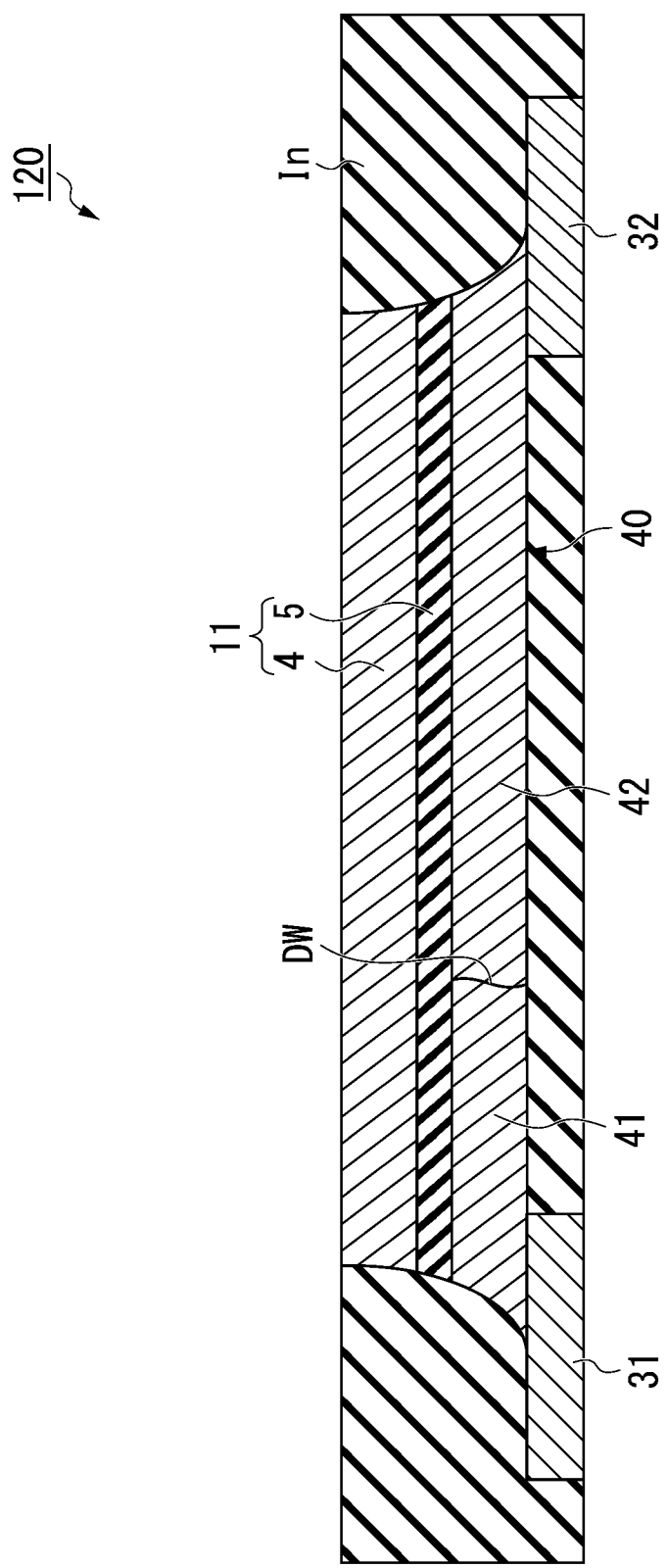
FIG. 11 is a cross-sectional view of a spin element according to a third embodiment.

FIG. 11 is a cross-sectional view of a magnetoresistance effect element 120 according to a third embodiment. FIG. 11 is a cross section of the magnetoresistance effect element 120 along an xz plane passing through the center of the width of a wiring 40 in the y direction. The magnetoresistance effect element 120 is different from the magnetoresistance effect element 100 in that a stacked body 11 is constituted by a nonmagnetic layer 5 and a first ferromagnetic layer 4 from close to the wiring 40. The same constituent elements as the magnetoresistance effect element 100 are designated by the same reference numerals, and the description thereof will be omitted.

The magnetoresistance effect element 120 includes the stacked body 11, the wiring 40, and the conductive portions 31 and 32. The stacked body 11 is constituted by the nonmagnetic layer 5 and the first ferromagnetic layer 4 from close to the wiring 40. The magnetoresistance effect element 120 is an element of which the resistance value changes due to the movement of a magnetic domain wall DW, and may be referred to as a magnetic domain wall movement element or magnetic domain wall movement type magnetoresistance effect element.

The wiring 40 is a magnetic layer. The wiring 40 includes a ferromagnetic material. As the ferromagnetic material forming the wiring 40, a metal selected from the group consisting of Cr, Mn, Co, Fe, and Ni, an alloy containing one or more of these metals, an alloy containing these metals and at least one or more elements of B, C, and N, or the like can be used. Specific examples thereof include Co—Fe, Co—Fe—B, and Ni—Fe.

The wiring 40 is a layer capable of magnetically recording information by changing an internal magnetic state. The wiring 21 has a first magnetic domain 41 and a second magnetic domain 42 inside. The magnetization of the first magnetic domain 41 and the magnetization of the second magnetic domain 42 are oriented in opposite directions, for example. A boundary between the first magnetic domain 41 and the second magnetic domain 42 is the magnetic domain wall DW. The wiring 40 can have the magnetic domain wall DW inside.

The magnetoresistance effect element 120 can record data in multiple values or continuously depending on a position of the magnetic domain wall DW of the wiring 40. The data recorded on the wiring 40 is read as a change in resistance value of the magnetoresistance effect element 120 when a read current is applied.

The magnetic domain wall DW moves by passing a write current in the x direction of the wiring 40 or by applying an external magnetic field. For example, when a write current (for example, a current pulse) is applied in the +x direction of the wiring 40, electrons flow in the −x direction opposite to the current, so that the magnetic domain wall DW moves in the −x direction. In a case in which a current flows from the first magnetic domain 41 to the second magnetic domain 42, the electrons spin-polarized in the second magnetic domain 42 reverse the magnetization of the first magnetic domain 41. By reversing the magnetization of the first magnetic domain 41, the magnetic domain wall DW moves in the −x direction.

Each of the first ferromagnetic layer 4 and the nonmagnetic layer 5 is the same as each of the first ferromagnetic layer 1 and the nonmagnetic layer 3 according to the first embodiment.

The first reference cell and the second reference cell in the third embodiment have the same configuration as the magnetoresistance effect element 120 except for the electrical resistance of the wiring.

In the magnetoresistance effect element 120 according to the third embodiment, the same effect as the magnetoresistance effect element 100 according to the first embodiment can also be obtained. Further, in the magnetoresistance effect element 120 according to the third embodiment, the same modification example as the magnetoresistance effect element 100 according to the first embodiment can be selected.

The magnetic recording arrays according to the first to third embodiments can be applied to a neuromorphic device. The neuromorphic device is a device that imitates the human brain by means of a neural network. The neuromorphic device artificially imitates the relationship between neurons and synapses in the human brain.

The neuromorphic device has, for example, hierarchically arranged chips (neurons in the brain) and transmission means (synapses in the brain) connecting them. The neuromorphic device increases the percentage of correct answers to questions by learning by means of the transmission means (synapses). Learning is to find knowledge that can be used in the future from information, and the neuromorphic device weights the input data.

Each synapse mathematically performs a product-sum calculation. In the magnetic recording arrays according to the first to third embodiments, the product-sum calculation can be performed by arranging the magnetoresistance effect elements or the magnetization rotation elements in an array shape. For example, when a current is passed through the read path of the magnetoresistance effect element, the product of the input current and the resistance of the magnetoresistance effect element is output, and the product calculation is performed. When a plurality of magnetoresistance effect elements are connected by a common wiring, the product calculation is added by the common wiring and the sum calculation is performed. Therefore, the magnetic recording arrays according to the first to third embodiments can be applied to the neuromorphic device as a product-sum calculator.

REFERENCE SIGNS LIST 1, 4 First ferromagnetic layer
2 Second ferromagnetic layer
3, 5 Nonmagnetic layer
10, 11 Stacked body
20, 21, 22, 23, 24, 40 wiring
101, 101A First reference cell
102, 102A Second reference cell
200 Magnetic recording array
DW Magnetic domain wall
t20, t23, t24 Thickness
w20, w21, w22 Wiring width

What is claimed is:

1. A magnetic recording array comprising:
a plurality of spin elements, a first reference cell, and a second reference cell,
wherein the plurality of spin elements, the first reference cell, and the second reference cell each have a wiring and a stacked body including a first ferromagnetic layer stacked on the wiring,
an electrical resistance of the wiring of the first reference cell is higher than an electrical resistance of the wiring of each spin element, and
an electrical resistance of the wiring of the second reference cell is lower than the electrical resistance of the wiring of each spin element.

2. The magnetic recording array according to claim 1, wherein a width of the wiring of the first reference cell is narrower than a width of the wiring of each spin element, and
a width of the wiring of the second reference cell is wider than the width of the wiring of each spin element.

3. The magnetic recording array according to claim 1, wherein a thickness of the wiring of the first reference cell is thinner than a thickness of the wiring of each spin element, and
a thickness of the wiring of the second reference cell is thicker than the thickness of the wiring of each spin element.

4. The magnetic recording array according to claim 1, wherein each wiring of the plurality of spin elements, the first reference cell, and the second reference cell is formed of the same material.

5. The magnetic recording array according to claim 1, wherein the electrical resistance of the wiring of the first reference cell is 105% or more of the electrical resistance of the wiring of each spin element, and
the electrical resistance of the wiring of the second reference cell is 95% or less of the electrical resistance of the wiring of each spin element.

6. The magnetic recording array according to claim 1, further comprising:
a power supply that is configured to generate a potential difference in a length direction of each wiring of the plurality of spin elements, the first reference cell, and the second reference cell,
wherein the power supply is configured to apply the same voltage to each wiring of the plurality of spin elements, the first reference cell, and the second reference cell.

7. The magnetic recording array according to claim 1, wherein, in each stacked body, the first ferromagnetic layer, a nonmagnetic layer, and a second ferromagnetic layer are stacked in this order and the first ferromagnetic layer is adjacent to each wiring, and
each wiring is any one of a metal, an alloy, an intermetallic compound, a metal boride, a metal carbide, a metal silicide, and a metal phosphate which have a function of generating a spin current due to a spin Hall effect when a current flows.

8. The magnetic recording array according to claim 1, wherein, in each stacked body, a nonmagnetic layer and the first ferromagnetic layer are stacked in this order and the first ferromagnetic layer is adjacent to each wiring, and
each wiring is a ferromagnetic layer capable of having a magnetic domain wall inside.

9. A neuromorphic device comprising the magnetic recording array according to claim 1.

10. A method of controlling a magnetic recording array which is a method of controlling the magnetic recording array according to claim 1, comprising:
a step of applying a same write voltage to each wiring of a spin element that is a write target among plurality of spin elements, the first reference cell, and the second reference cell;
after the step of applying the same write voltage, a step of applying a read voltage in a stacking direction of the spin element that is the write target, in a stacking direction of the first reference cell, and in a stacking direction of the second reference cell; and
a step of comparing the electrical resistance of the spin element with the electrical resistances of the first reference cell and the second reference cell.

11. The method of controlling a magnetic recording array according to claim 10, wherein, when comparing the electrical resistance of the spin element with the electrical resistances of the first reference cell and the second reference cell, in a case in which the electrical resistance of the spin element is not between the electrical resistance of the first reference cell and the electrical resistance of the second reference cell, writing to the spin element is prohibited.

12. The method of controlling a magnetic recording array according to claim 10, wherein, when comparing the electrical resistance of the spin element with the electrical resistances of the first reference cell and the second reference cell, in a case in which the electrical resistance of the spin element is not between the electrical resistance of the first reference cell and the electrical resistance of the second reference cell, the spin element to and from which data is written and read is replaced with another spin element.

* * * * *